(12) United States Patent
Tsai et al.

(10) Patent No.: US 8,993,417 B2
(45) Date of Patent: Mar. 31, 2015

(54) FINFET FIN BENDING REDUCTION

(71) Applicant: Taiwan Semiconductor Manufacturing Company, Ltd., Hsin-Chu (TW)

(72) Inventors: Chun Hsiung Tsai, Xinpu Township (TW); Shiang-Rung Tsai, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/930,944

(22) Filed: Jun. 28, 2013

(65) Prior Publication Data
US 2015/0004772 A1 Jan. 1, 2015

(51) Int. Cl.
*H01L 21/76* (2006.01)
*H01L 27/092* (2006.01)
*H01L 21/762* (2006.01)
*H01L 29/66* (2006.01)

(52) U.S. Cl.
CPC .... *H01L 21/76224* (2013.01); *H01L 29/66795* (2013.01)
USPC ........... 438/478; 438/424; 438/585; 257/351; 257/E21.09

(58) Field of Classification Search
CPC ............... H01L 21/823431; H01L 21/823821; H01L 21/845; H01L 27/10826
See application file for complete search history.

(56) References Cited

U.S. PATENT DOCUMENTS

| 2012/0025296 A1* | 2/2012 | Kim ............................... 257/324 |
| 2012/0037994 A1* | 2/2012 | Saitoh et al. .................. 257/351 |
| 2012/0187375 A1* | 7/2012 | Guo et al. ........................ 257/24 |
| 2013/0099350 A1* | 4/2013 | Peng et al. ..................... 257/510 |
| 2013/0214360 A1* | 8/2013 | Siprak ............................ 257/365 |

OTHER PUBLICATIONS

Floresca, Herman C., et al., "Shallow Trench Isolation Liners and their Role in Reducing Lattice Strains," Applied Physics Letters 93, Oct. 10, 2008, 2 pages.
Lee, Han Sin, et al., "An Optimized Densification of the Filled Oxide for Quarter Micron Shallow Trench Isolation (STI), 1996 Symposium on VLSI Technology Digest of Technical Papers," pp. 158-159.

* cited by examiner

*Primary Examiner* — Mamadou Diallo
(74) *Attorney, Agent, or Firm* — Slater & Matsil, L.L.P.

(57) ABSTRACT

An embodiment method of controlling fin bending in a fin field-effect transistor (FinFET) includes forming an isolation region over a substrate, performing a first annealing process, the first annealing process including a first wet anneal, the first wet anneal removing impurities from the isolation region; a second wet anneal, the second wet anneal forming silanol in the isolation region; and a first dry anneal, the first dry anneal dehydrating the isolation region. In an embodiment, the first annealing process is followed by a chemical mechanical planarization (CMP) process, an etching process, and a second annealing process for the isolation region.

20 Claims, 5 Drawing Sheets

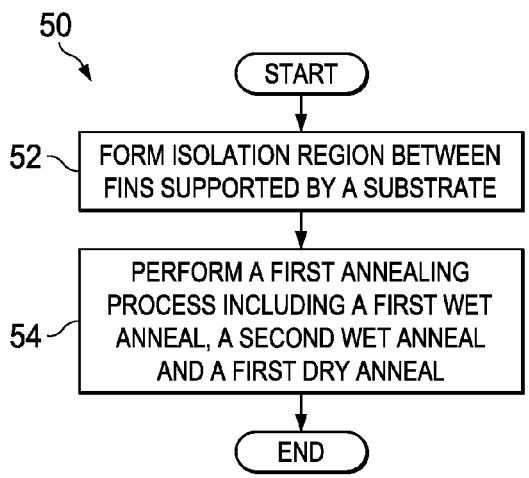
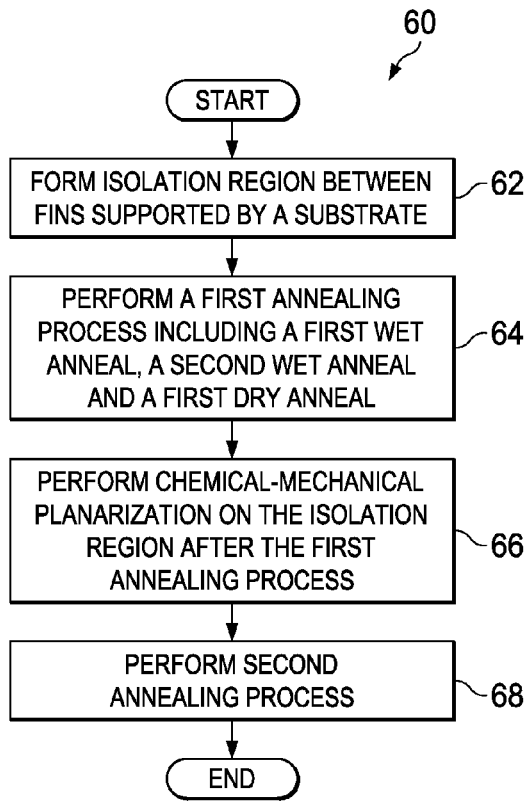
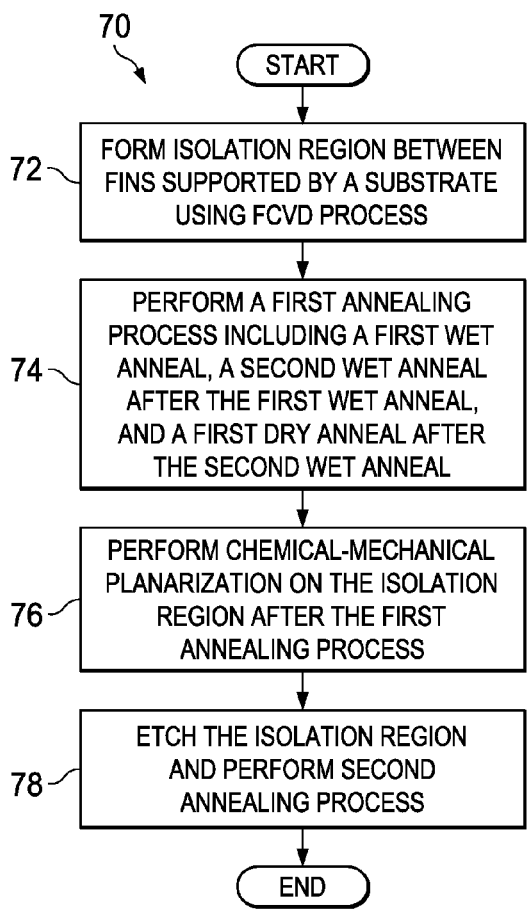

US 8,993,417 B2

FINFET FIN BENDING REDUCTION

BACKGROUND

Semiconductor devices are used in a large number of electronic devices, such as computers, cell phones, and others. Semiconductor devices comprise integrated circuits that are formed on semiconductor wafers by depositing many types of thin films of material over the semiconductor wafers, and patterning the thin films of material to form the integrated circuits. Integrated circuits include field-effect transistors (FETs) such as metal oxide semiconductor (MOS) transistors.

One of the goals of the semiconductor industry is to continue shrinking the size and increasing the speed of individual FETs. To achieve these goals, fin FETs (FinFETs) or multiple gate transistors are used in sub 32 nm transistor nodes. FinFETs not only improve areal density, but also improve gate control of the channel.

BRIEF DESCRIPTION OF THE DRAWINGS

For a more complete understanding of the present disclosure, and the advantages thereof, reference is now made to the following descriptions taken in conjunction with the accompanying drawing, in which:

FIGS. 3A-3B and FIGS. 3C-3D 4-15 illustrate examples of fin bending and the improvement in fin bending using the embodiment method of FIG. 2;

FIG. 4 illustrates embodiment method of controlling fin bending in the FinFET of FIG. 1;

FIG. 5 illustrates embodiment method of controlling fin bending in the FinFET of FIG. 1; and FIG. 6 illustrates embodiment method of controlling fin bending in the FinFET of FIG. 1.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of the present embodiments are discussed in detail below. It should be appreciated, however, that the present disclosure provides many applicable inventive concepts that can be embodied in a wide variety of specific contexts. The specific embodiments discussed are merely illustrative, and do not limit the scope of the disclosure.

The present disclosure will be described with respect to embodiments in a specific context, namely a fin field-effect transistor (FinFET). The disclosure may also be applied, however, to other integrated circuits, electronic structures, and the like.

Figure 1:
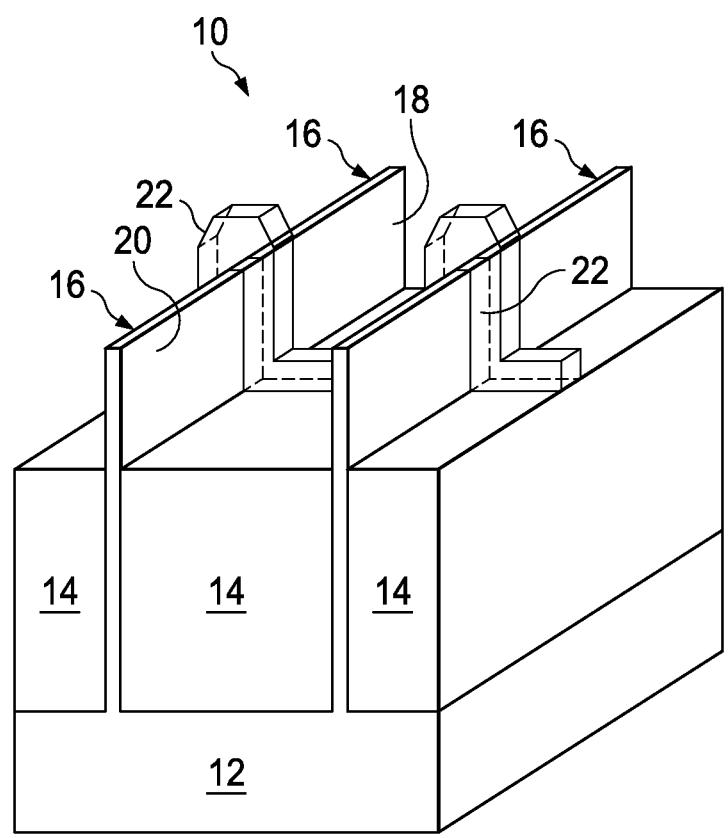
FIGS. 1 illustrates a typical fin field-effect transistor (FinFET)

Referring now to FIG. 1, a typical fin field-effect transistor (FinFET) 10 is illustrated. As shown, the FinFET 10 includes a semiconductor substrate 12. The semiconductor substrate 12 may be bulk silicon, germanium, silicon germanium, a silicon-containing material, or another suitable semiconductor material. Isolation regions, such as shallow trench isolation (STI) regions 14, may be formed over the semiconductor substrate 12. In addition, a semiconductor fin 16 is formed above top surfaces of the STI regions 14. While two of the fins 16 are illustrated in FIG. 1, it should be recognized that practical applications may include several of the fins 16 in the FinFET 10.

Still referring to FIG. 1, a source 18 and a drain 20 are formed in the semiconductor fin 16 on opposing sides of a gate 22 (i.e., gate stack). As shown, the gate 22 wraps around and follows the profile of the semiconductor fin 16. A channel region 24 is disposed in the semiconductor fin 16 beneath the gate 22 and between the source 18 and the drain 20.

It should be recognized that the FinFET 10 of FIG. 1 may include several other layers, structures, features, and so on in practical applications. In other words, the basic and example FinFET 10 of FIG. 1 is provided for context only. Thus, the present disclosure should not be limited to the FinFET 10 as configured and depicted in FIG. 1.

One of the steps used to manufacture the typical FinFET 10 of FIG. 1 may include, for example, an annealing of the shallow trench isolation regions 14. By way of example, a conventional annealing process may include, for example, a wet anneal at 400° C. for about 20 minutes followed by a dry anneal at 1000° C. for about 2 hours.

While conventional annealing of the shallow trench isolation regions 14 is beneficial in the FinFET 10 formation process, it may produce undesirable side effects. By way of example, the annealing process may result in thermal oxidation. Thermal oxidation may cause a layer of oxide to form or grow on surfaces of the fins 16. The layer of oxide may be as thick as, for example, 36 Angstroms if the conventional annealing process is used.

Unfortunately, the relatively thick layer of oxide biases adjacent fins 16 away from each other. In some circumstances, this causes an outward bending or bowing of the fins 16 in the FinFET 10. Indeed, the fins 16 in the FinFET 10 may bend as much as nine nanometers (9 nm) due to the layer of oxide produced by thermal oxidation. Depending on the amount of bending in the fins, the reliability and/or performance of the FinFET 10 may be compromised.

Figure 2:
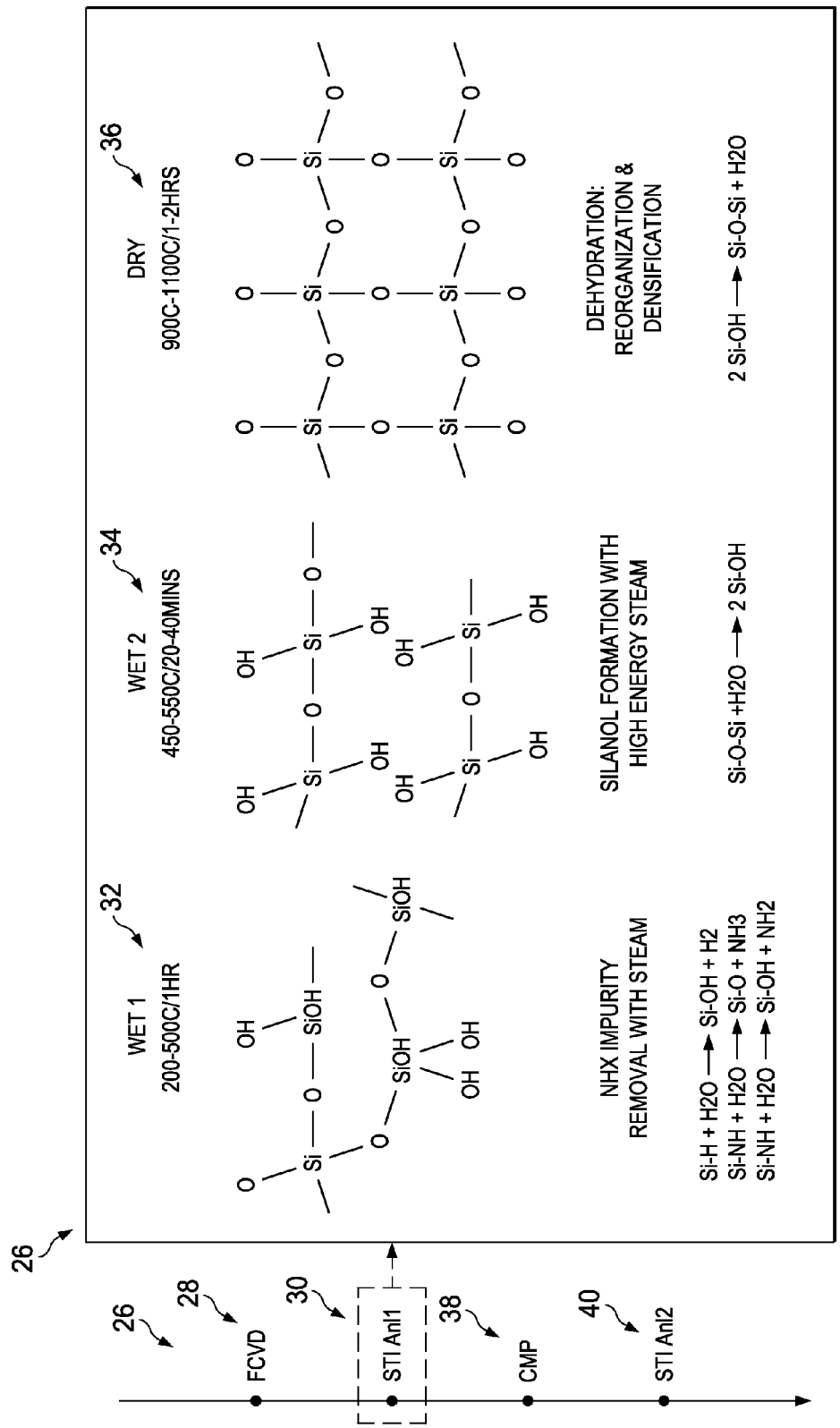
FIG. 2 illustrates an embodiment method of controlling fin bending in the FinFET of FIG. 1.

Referring now to FIG. 2, an embodiment method 26 of controlling fin 16 bending in the FinFET 10 of FIG. 1 is illustrated. As shown, the method 26 includes forming an isolation region (e.g., isolation region 14 in FIG. 1) between fins (e.g., fins 16 in FIG. 1) supported by a substrate (e.g., substrate 12 in FIG. 1). In an embodiment, the isolation region is a shallow trench isolation region formed using a flowable chemical vapor deposition (FCVD) process.

After formation of the isolation region 28, a first annealing process 30 is performed. As shown in FIG. 2, the first annealing process 30 includes a first wet anneal 32, a second wet anneal 34, and a dry anneal. In an embodiment, the first wet anneal 32, which utilizes steam, removes impurities such as, for example, hydrogen and compounds of nitrogen and hydrogen, from the isolation region. In an embodiment, the first wet anneal 32 is performed at a temperature of between about 200° C. to about 500° C. and for a time of about an hour.

After the first wet anneal 32 has been performed, the second wet anneal 34 is performed. In an embodiment, the second wet anneal 34, which also utilizes steam, forms silanol in the isolation region. In an embodiment, the second wet anneal 34 is performed at a temperature of between about 450° C. to about 550° C. and for a time of between about twenty minutes to about forty minutes. Notably, despite the overlap in temperature ranges for the first wet anneal 32 and the second wet anneal 34, the second wet anneal 34 is typically performed at a temperature higher than the temperature of the first wet anneal 32.

After the second wet anneal 34 has been performed, the first dry anneal 36 is performed. In an embodiment, the first dry anneal 36 dehydrates the isolation region. In an embodiment, the first dry anneal 36 is performed at a temperature of between about 900° C. to about 1100° C. and for a time of between about sixty minutes to about one hundred twenty minutes (i.e., about 1 hour to about 2 hours).

In an embodiment, after the first annealing process 30 is performed, the nitrogen concentration in the insolation region has been reduced to a normalized amount between about $1 \times 10^{10}$ and about $5 \times 10^{10}$.

Still referring to FIG. 2, after the first dry anneal 36 is performed and the first anneal process 30 completed, in an embodiment a chemical-mechanical planarization (CMP) 38 is performed on the isolation region. The chemical-mechanical planarization 38 is performed to provide normal end point detection (EPD). In other words, the chemical-mechanical planarization is performed such that abnormal end point detections are avoided. In an embodiment, hydrogen fluoride (HF) at an etch rate of between about 1.5 to about 1.6 is used for the chemical-mechanical planarization 38.

After the chemical-mechanical planarization 38 is performed, an etching process may be performed to remove a portion of the isolation region and expose the fins 16, as shown in FIG. 1. In an embodiment, the etching process is performed at a wet etch rate (WER) of between about 100 Angstroms per minute and between about 150 Angstroms per minute. In an embodiment, the wet etching rate of the isolation region is proportional to the nitrogen concentration in the isolation region. In addition, it has been discovered that the wet etching rate is dominated by the second wet anneal 34 in the first annealing process 30 of FIG. 2. In other words, the thermal budget affects the wet etching rate.

Still referring to FIG. 2, after the chemical-mechanical planarization 38 is performed, a second annealing process 40 may be performed. In an embodiment, the steps of the second annealing process 40 are identical to, or substantially the same as, those of the first annealing process 30. In other words, the first and second annealing processes 30, 40 have parameters that match.

Figure 3A:
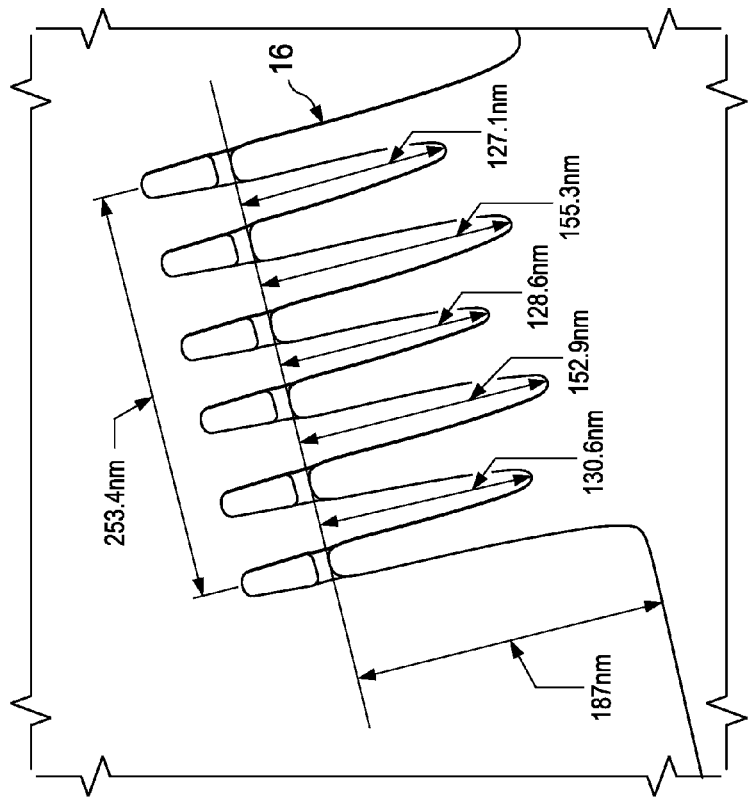
Figure 3B:
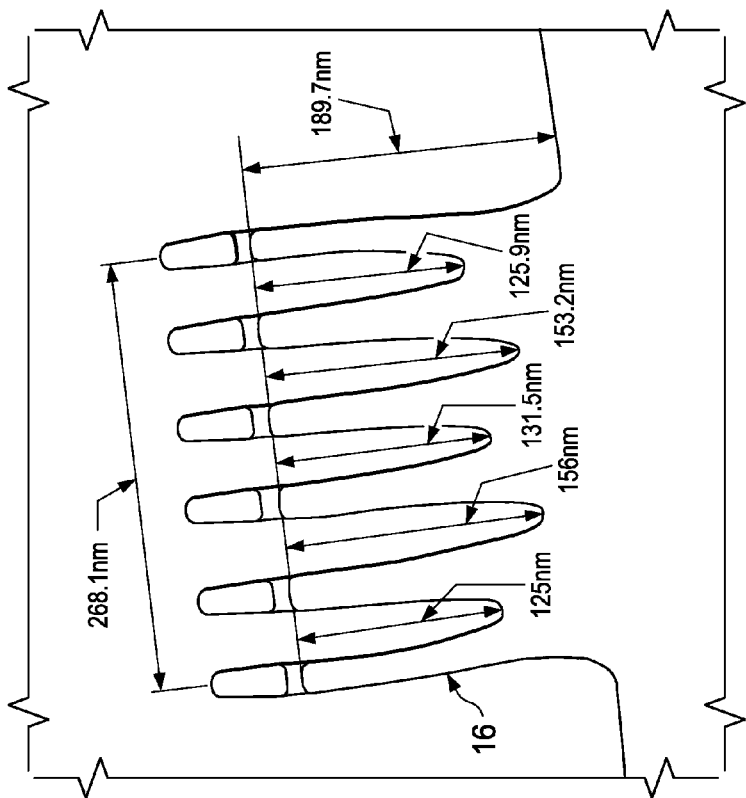

Referring now to FIGS. 3A-3B, an example of reduced fin 16 bending is provided. In FIG. 3A, which illustrates a FinFET formed using the conventional annealing process for the isolation region, the collective width of the fins was measured to be about 268.1 nm. In contrast, FIG. 3B, which illustrates a FinFET formed using the embodiment annealing process of FIG. 2, the collective width of the fins was measured to be about 253.4 nm. Indeed, the bending of the individual fins 16 in FIG. 3A is noticeably greater than the bending of the fins in FIG. 3B.

Figure 3D:
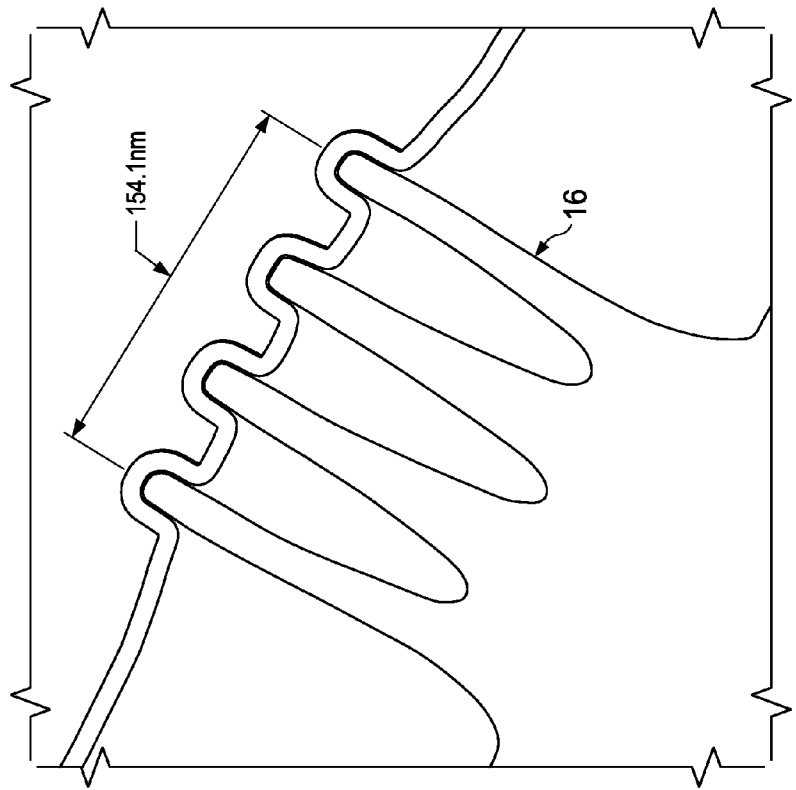
Figure 3C:
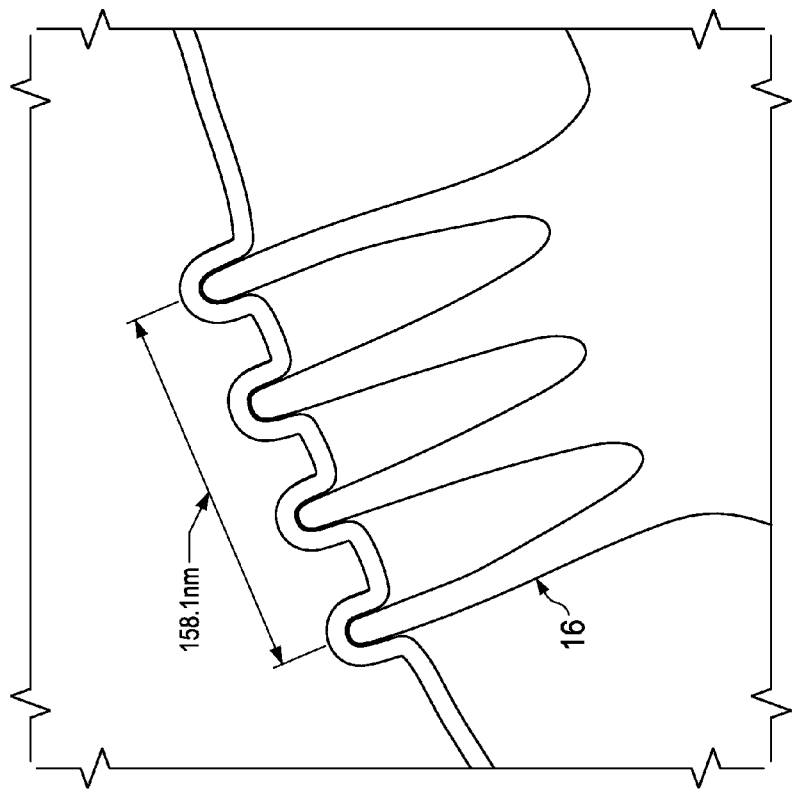

Referring now to FIGS. 3C-3D, another example of reduced fin 16 bending is provided. In FIG. 3C, which illustrates a FinFET formed using the conventional annealing process for the isolation region, the collective width of the fins was measured to be about 158.1 nm. In contrast, FIG. 3D, which illustrates a FinFET formed using the embodiment annealing process of FIG. 2, the collective width of the fins was measured to be about 154.1 nm. Indeed, the bending of the individual fins 16 in FIG. 3C is noticeably greater than the bending of the fins in FIG. 3D.

Using the embodiment annealing process of FIG. 2, the fins 16 in the FinFET 10 may only bend about five nanometers (5 nm), an perhaps as little as about three nanometers (3 nm). This is relative to about nine nanometers (9 nm) from the conventional process, as noted above. Moreover, when the embodiment method 26 is employed, the layer of oxide may be limited to a thickness of about 20 Angstroms. This is relative to the layer of oxide having a thickness of about 36 Angstroms from the conventional annealing process.

Referring now to FIG. 4, an embodiment method 50 of controlling fin bending in a fin field-effect transistor (FinFET) is provided. In block 52, an isolation region is formed between fins supported by a substrate. In block 54, a first annealing process includes a first wet anneal, a second wet anneal, and a first dry anneal, is performed. The first wet anneal removes impurities from the isolation region, the second wet anneal forms silanol in the isolation region, and the first dry anneal dehydrates the isolation region.

Referring now to FIG. 5, an embodiment method 60 of controlling fin bending in a fin field-effect transistor (FinFET) is provided. In block 62, an isolation region is formed between fins supported by a substrate. In block 64, a first annealing process includes a first wet anneal, a second wet anneal, and a first dry anneal, is performed. The first wet anneal removes impurities from the isolation region, the second wet anneal forms silanol in the isolation region, and the first dry anneal dehydrates the isolation region. In block 66, a chemical-mechanical planarization (CMP) is performed on the isolation region after the first annealing process. In block 68, a second annealing process is performed.

Referring now to FIG. 6, an embodiment method 70 of controlling fin bending in a fin field-effect transistor (FinFET) is provided. In block 72, an isolation region is formed between fins supported by a substrate. The isolation region is formed using a flowable chemical vapor deposition (FCVD) process. In block 74, a first annealing process includes a first wet anneal, a second wet anneal, and a first dry anneal, is performed. The first wet anneal removes impurities from the isolation region, the second wet anneal forms silanol in the isolation region, and the first dry anneal dehydrates the isolation region. In block 76, a chemical-mechanical planarization (CMP) is performed on the isolation region after the first annealing process. In block 78, a second annealing process is performed.

From the foregoing, it should be recognized that the embodiment annealing process 30 offers numerous benefits and advantages. In particular, the embodiment annealing process 30 ensures that fin bending is reduces or substantially mitigated. Indeed, in some cases the fin bending is reduced by about than 50% (e.g. 9 nm vs. 5 nm) or more. In addition, an abnormal chemical mechanical planarization penalty is not incurred when the embodiment annealing process is employed.

While the disclosure provides illustrative embodiments, this description is not intended to be construed in a limiting sense. Various modifications and combinations of the illustrative embodiments, as well as other embodiments, will be apparent to persons skilled in the art upon reference to the description. It is therefore intended that the appended claims encompass any such modifications or embodiments.

What is claimed is:

1. A method of controlling fin bending in a fin field-effect transistor (FinFET), comprising:
    forming an isolation region between fins supported by a substrate;
    performing a first annealing process, the first annealing process including:
        a first wet anneal, the first wet anneal removes impurities from the isolation region;
        a second wet anneal, the second wet anneal forms silanol in the isolation region; and
        a first dry anneal, the first dry anneal dehydrates the isolation region; and performing a chemical-mechanical planarization (CMP) on the isolation region after the first annealing process; and performing a second annealing process.

2. The method of claim 1, wherein the impurities removed by the first wet anneal are at least one of hydrogen and a compound of nitrogen and hydrogen and wherein at least one of the first wet anneal and the second wet anneal comprises using steam.

3. The method of claim 1, further comprising at least one of performing the first wet anneal at a temperature of between about 200° C. to about 500° C. and for a time of about an hour, performing the second wet anneal at a temperature of between about 450° C. to about 550° C. and for a time of between about twenty minutes to about forty minutes, and performing the first dry anneal at a temperature of between about 900° C. to about 1100° C. and for a time of between about sixty minutes to about one hundred twenty minutes.

4. The method of claim 1, wherein the second annealing process includes a third wet anneal, the third wet anneal removes impurities from the isolation region, a fourth wet anneal, the fourth wet anneal forms silanol in the isolation region, and a second dry anneal, the second dry anneal dehydrates the isolation region.

5. The method of claim 4, wherein an etching is performed at a wet etch rate (WER) of between about 100 Angstroms per minute and between about 150 Angstroms per minute.

6. The method of claim 4, further comprising performing the third wet anneal at a temperature of between about 200° C. to about 500° C. and for a time of about an hour, performing the fourth wet anneal at a temperature of between about 450° C. to about 550° C. and for a time of between about twenty minutes to about forty minutes, and performing the second dry anneal at a temperature of between about 900° C. to about 1100° C. and for a time of between about sixty minutes to about one hundred twenty minutes.

7. A method of controlling fin bending in a fin field-effect transistor (FinFET), comprising:

forming an isolation region between fins supported by a substrate; and performing a first annealing process, the first annealing process including a first wet anneal, a second wet anneal following the first wet anneal, and a first dry anneal following the second wet anneal.

8. The method of claim 7, wherein impurities removed by the first wet anneal are at least one of hydrogen and a compound of nitrogen and hydrogen.

9. The method of claim 7, further comprising performing the second wet anneal at a temperature of between about 450° C. to about 550° C. and for a time of between about twenty minutes to about forty minutes and at a wet etch rate (WER) of between about 100 Angstroms per minute and between about 150 Angstroms per minute.

10. The method of claim 7 wherein:

the first wet anneal removes impurities from the isolation region;

the second wet anneal forms silanol in the isolation region; and the first dry anneal dehydrates the isolation region.

11. The method of claim 7, further comprising forming the isolation region using a flowable chemical vapor deposition (FCVD) process.

12. The method of claim 10, wherein the impurities removed by the first wet anneal are at least one of hydrogen and a compound of nitrogen and hydrogen.

13. The method of claim 7, wherein performing at least one of the first wet anneal and the second wet anneal comprises using steam.

14. The method of claim 7, further comprising performing the first wet anneal at a temperature of between about 200° C. to about 500° C. and for a time of about an hour.

15. The method of claim 7, further comprising performing the second wet anneal at a temperature of between about 450° C. to about 550° C. and for a time of between about twenty minutes to about forty minutes.

16. The method of claim 7, further comprising performing the first dry anneal at a temperature of between about 900° C. to about 1100° C. and for a time of between about sixty minutes to about one hundred twenty minutes.

17. The method of claim 7, further comprising performing a chemical-mechanical planarization (CMP) on the isolation region after the first annealing process.

18. The method of claim 17, further comprising etching the isolation region at a wet etch rate (WER) of between about 100 Angstroms per minute and between about 150 Angstroms per minute after the chemical-mechanical planarization.

19. The method of claim 18, further comprising performing a second annealing process after the etching, wherein steps of the second annealing process match those of the first annealing process.

20. The method of claim 10, further comprising reducing a nitrogen concentration in the isolation regions to a normalized amount between about $1 \times 10^{10}$ and about $5 \times 10^{10}$.

* * * * *